United States Patent
Hayashi et al.

(10) Patent No.: US 10,564,541 B2
(45) Date of Patent: Feb. 18, 2020

(54) PATTERN FORMATION METHOD AND ARTICLE MANUFACTURING METHOD

(71) Applicant: CANON KABUSHIKI KAISHA, Tokyo (JP)

(72) Inventors: Tatsuya Hayashi, Utsunomiya (JP); Keiji Emoto, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 385 days.

(21) Appl. No.: 15/421,745

(22) Filed: Feb. 1, 2017

(65) Prior Publication Data
US 2017/0227855 A1 Aug. 10, 2017

(30) Foreign Application Priority Data

Feb. 4, 2016 (JP) .................................. 2016-020240
Jan. 13, 2017 (JP) .................................. 2017-004610

(51) Int. Cl.
*G03F 7/00* (2006.01)
*G03F 7/20* (2006.01)

(52) U.S. Cl.
CPC .......... *G03F 7/0002* (2013.01); *G03F 7/7045* (2013.01)

(58) Field of Classification Search
CPC .................................................... G03F 7/0002
See application file for complete search history.

(56) References Cited

U.S. PATENT DOCUMENTS

2012/0244461 A1 9/2012 Nagai
2015/0008605 A1 1/2015 Sato

FOREIGN PATENT DOCUMENTS

JP 2012204833 A 10/2012
JP 2015029070 A 2/2015

*Primary Examiner* — Larry W Thrower
(74) *Attorney, Agent, or Firm* — Rossi, Kimms & McDowell LLP

(57) ABSTRACT

A method of forming a pattern on a substrate includes forming a group of first patterns so as to define a first region on each of a plurality of substrates by using a projection exposure apparatus, and forming a group of second patterns so as to define a second region on the first region of each of substrates different from each other out of the plurality of substrates by using a plurality of imprint apparatuses. A plurality of second regions, which are respectively defined by the plurality of imprint apparatuses in the forming the group of second patterns, are different in shape but have a common component. In the forming the group of first patterns, the first regions are deformed in accordance with the common component.

14 Claims, 10 Drawing Sheets

| FORM GROUP OF FIRST PATTERNS BY USING PROJECTION EXPOSURE APPARATUS SO AS TO DEFINE FIRST REGION WITH DEFORMATION ACCORDING TO COMMON COMPONENT IN DEFORMATION IN SECOND REGION DEFINED BY PLURAL IMPRINT APPARATUSES (FIRST STEP) | S210 |

↓

| FORM GROUPS OF SECOND PATTERNS BY USING PLURAL IMPRINT APPARATUSES, RESPECTIVELY (SECOND STEP) | S220 |

PATTERN FORMATION METHOD AND ARTICLE MANUFACTURING METHOD

BACKGROUND OF THE INVENTION

Field of the Invention

The present invention relates to a pattern formation method and an article manufacturing method.

Description of the Related Art

An imprint technique has received attention as one of lithography techniques for manufacturing an article such as a semiconductor device or a MEMS. The imprint technique arranges an imprint material on a substrate and cures the imprint material in a state in which the imprint material is in contact with a mold, thereby forming a pattern. The imprint technique can be used together with a photolithography technique using a projection exposure apparatus in manufacturing the article. For example, a method of forming one layer by the projection exposure apparatus and forming another layer on that layer by an imprint apparatus can be adopted.

Japanese Patent Laid-Open No. 2015-29070 describes a method of forming the first pattern by using a projection exposure apparatus, and then forming the second pattern by using an imprint apparatus. In this method, the shape of the first pattern formed by using the projection exposure apparatus is corrected so as to match the shape of the second pattern formed by using the imprint apparatus.

At present, a time required to form the pattern by using the imprint apparatus is much longer than a time required to form the pattern by using the projection exposure apparatus. To cope with this, in equipment (so-called cluster) in which a plurality of imprint apparatuses are assigned to one projection exposure apparatus, there is considered a technique of forming patterns by using the plurality of imprint apparatuses concurrently with a plurality of substrates each on which a pattern is formed by using one projection exposure apparatus. When the plurality of imprint apparatuses are used, an individual difference that exists between them may become a problem. For example, a mold holding mechanism and a substrate holding mechanism can be different from each other in flatness of a holding surface in the plurality of imprint apparatuses.

When the method described in Japanese Patent Laid-Open No. 2015-29070 is applied to a method of manufacturing an article by assigning the plurality of imprint apparatuses to one projection exposure apparatus, a correction amount in the projection exposure apparatus can be changed in accordance with each of the plurality of imprint apparatuses. However, it is troublesome and inefficient, for example, in one lot, for the projection exposure apparatus to perform exposure in accordance with the correction amount according to each of the plurality of imprint apparatuses to be processed later. Moreover, in this method, on a substrate on which the projection exposure apparatus forms a pattern for a certain imprint apparatus, only the imprint apparatus can form a next pattern. For example, if an imprint apparatus stops due to a breakdown or the like, a next pattern cannot be formed on the substrate on which the projection exposure apparatus forms a pattern for the imprint apparatus. This causes a delay in processing the lot, and thus it is inefficient.

SUMMARY OF THE INVENTION

The present invention provides a technique advantageous in forming a pattern efficiently in equipment in which a plurality of imprint apparatuses are assigned to one projection exposure apparatus.

One of aspects of the present invention provides a method of forming a pattern on a substrate, the method comprising: forming a group of first patterns so as to define a first region on each of a plurality of substrates by using a projection exposure apparatus; and forming a group of second patterns so as to define a second region on the first region of each of substrates different from each other out of the plurality of substrates by using a plurality of imprint apparatuses, wherein a plurality of second regions, which are respectively defined by the plurality of imprint apparatuses in the forming the group of second patterns, are different in shape but have a common component, and in the forming the group of first patterns, the first regions are deformed in accordance with the common component.

Further features of the present invention will become apparent from the following description of exemplary embodiments with reference to the attached drawings.

DESCRIPTION OF THE EMBODIMENTS

Exemplary embodiments of the present invention will be described below with reference to the accompanying drawings.

First Embodiment

Figure 1:
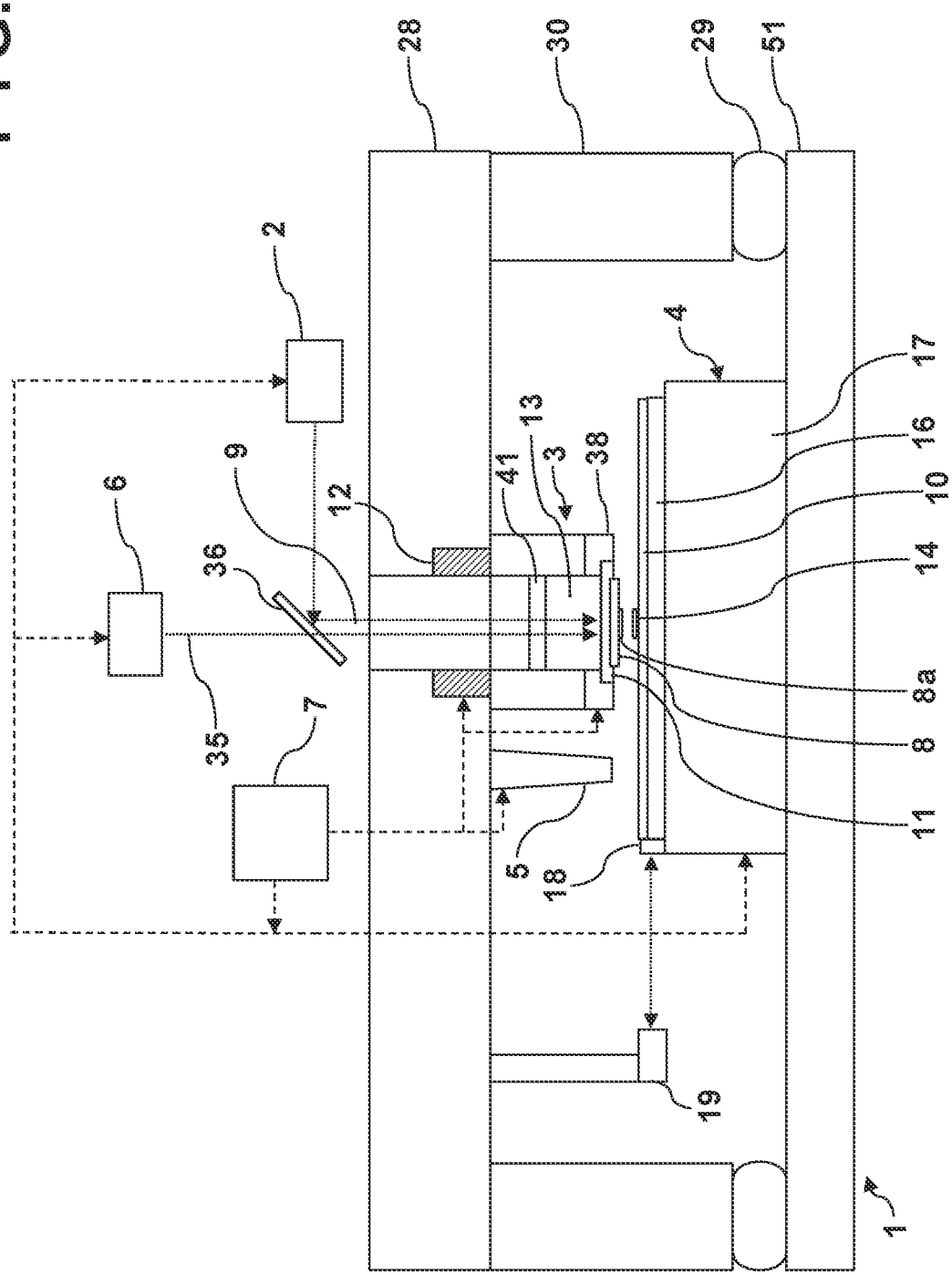
FIG. 1 is a view showing the arrangement of an imprint apparatus to which the first embodiment of the present invention can be applied.

FIG. 1 shows the arrangement of an imprint apparatus 1 to which the first embodiment of the present invention can be applied. The imprint apparatus 1 can be used to manufacture an article such as a semiconductor device or a MEMS. The imprint apparatus 1 arranges an uncured resin 14 on a substrate 10, molds the uncured resin 14 by a mold 8, and cures the molded uncured resin 14, thereby forming a resin pattern. The uncured resin and a resin formed by curing can be referred to as imprint materials.

The imprint materials are curable compositions and are typically cured by light irradiation or application of heat. Out of these compositions, a photo-curable composition that is cured by light can contain at least a polymerizable compound and a photopolymerization initiator. The photo-curable composition can additionally contain a non-polymerizable compound or solvent. The non-polymerizable compound can be, for example, at least a material selected from the group consisting of a sensitizer, a hydrogen donor, an internal mold release agent, a surfactant, an antioxidant, a polymer component, and the like. An example will be described below in which light is used to cure the uncured resin 14. It is to be understood, however, that this is merely an example.

Directions are indicated below in an X-Y-Z coordinate system having an X-Y plane in a direction parallel to the surface of the substrate 10. The imprint apparatus 1 can include an exposure illumination system (curing unit) 2, a mold operation mechanism 3, a substrate operation mechanism 4, a dispenser (supply unit) 5, a shape correction mechanism 38, and a controller 7. In an imprint process, the exposure illumination system 2 irradiates the uncured resin 14 on the substrate 10 with light 9 such as an ultraviolet beam via the mold 8. The exposure illumination system 2 can include, for example, a light source and an optical element which adjusts the light 9 emitted from the light source to light suitable for imprint. The light 9 can be reflected by a dichroic mirror 36, and guided to the mold 8 and the substrate 10.

Figure 2:
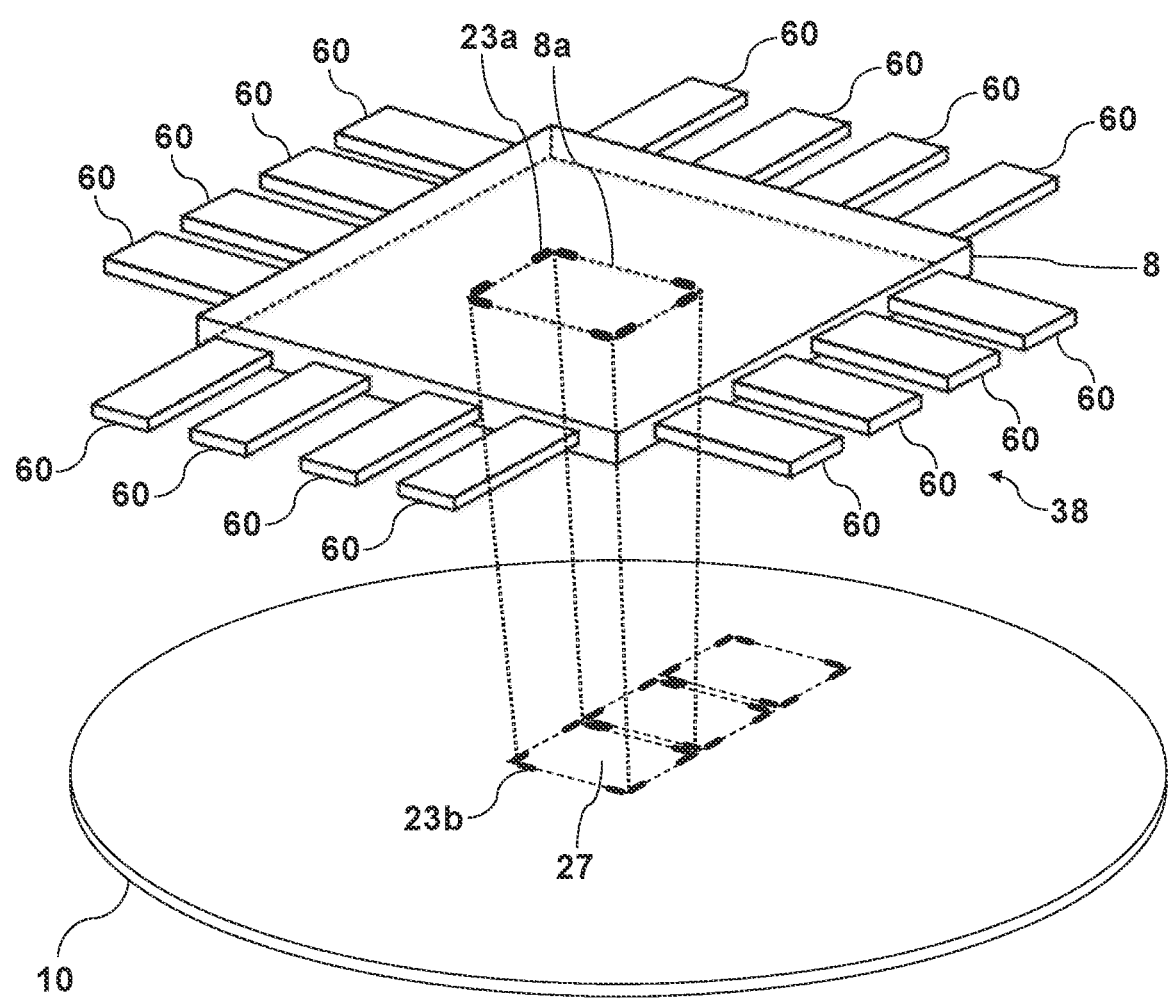
FIG. 2 is a view showing the arrangement of a shape correction mechanism of the imprint apparatus shown in FIG. 1.

As exemplified in FIG. 2, the mold 8 has a rectangular (for example, a square) peripheral shape, and a pattern portion 8a with a three-dimensionally formed concave-convex pattern such as a circuit pattern that should be transferred is arranged on a surface facing the substrate 10. Further, the mold 8 can be made of a material such as quartz capable of transmitting the light 9. Furthermore, the mold 8 can have a cavity (concave portion) having a circular planar shape and a certain depth on a surface irradiated with the light 9 in order to make easier for the shape correction mechanism 38 to deform the pattern portion 8a.

The mold operation mechanism 3 can include a mold holding mechanism 11 which holds the mold 8, and a mold driving mechanism 12 which holds the mold holding mechanism 11 and performs attitude control and z-direction movement of the mold 8. The mold holding mechanism 11 can hold the mold 8 by chucking the peripheral region on the irradiation surface of the light 9 in the mold 8 with a vacuum suction force or an electrostatic force. For example, when the mold holding mechanism 11 holds the mold 8 with the vacuum suction force, the mold holding mechanism 11 is connected to an externally provided vacuum pump (not shown), and attaching/detaching of the mold 8 can be switched by turning on/off the vacuum pump.

The mold holding mechanism 11 and the mold driving mechanism 12 can include an opening region 13 in the center (inside) such that the substrate 10 is irradiated with the light 9 emitted from the exposure illumination system 2. In the opening region 13, a light-transmitting member 41 (for example, a quartz plate) having a space enclosed with the mold 8 and a part of the opening region 13 as a sealed space can be installed, and a pressure controller (not shown) including a pressure source or the like can adjust the pressure of the space in the opening region 13. The pressure controller can be configured to, for example, warp the pattern portion 8a into a convex shape toward the substrate 10 by setting the pressure of the space in the opening region 13 to be higher than its external pressure when the mold 8 is pressed against the uncured resin 14 on the substrate 10. This makes it possible to bring the pattern portion 8a into contact with the uncured resin 14 from its center. With this method, it is possible to restrain a gas from remaining between the pattern portion 8a and the uncured resin 14, and to fill the concave-convex portion of the pattern portion 8a with the uncured resin 14. Alternatively, the mold 8 and the uncured resin 14 on the substrate 10 may be brought into contact with each other not by warping the pattern portion 8a into the convex shape toward the substrate 10 but by warping the substrate 10 into a convex shape toward the pattern portion 8a.

The mold driving mechanism 12 presses the mold 8 against the uncured resin 14 on the substrate 10 and separates the mold 8 from the cured resin. The mold driving mechanism 12 can include, for example, a voice coil motor and/or an air cylinder as an actuator. Further, the mold driving mechanism 12 may be made of a plurality of driving systems such as a coarse driving system and a fine driving system in order to allow the mold 8 to be positioned accurately. Furthermore, the mold driving mechanism 12 may have a position adjustment function not only in a Z-axis direction but also in the X-axis direction, a Y-axis direction, or a ωz-axis direction (rotational direction around a Z-axis), a tilt function of correcting the tilt of the mold 8, and the like. An operation of pressing the mold 8 (pattern portion 8a) against the uncured resin 14 and separating the mold 8 from the cured resin in the imprint apparatus 1 may be implemented by moving the mold 8 in the Z-axis direction. However, the pressing and separating operation may be implemented by moving the substrate 10 in the Z-axis direction. Alternatively, the pressing and separating operation may be implemented by moving both the mold 8 and the substrate 10.

The substrate operation mechanism 4 can include a substrate holding mechanism 16 which holds the substrate 10, and a substrate driving mechanism 17 which performs alignment between the mold 8 and the substrate 10. The substrate holding mechanism 16 can hold the substrate 10 with a vacuum suction force or an electrostatic force. The substrate driving mechanism 17 can include, for example, a linear motor or a plane pulse motor as an actuator. The substrate driving mechanism 17 may be made of a plurality of driving systems such as a coarse driving system and a fine driving system in the respective X-axis and Y-axis directions. The substrate driving mechanism 17 can further include at least one of a driving system for adjusting the position of the substrate 10 in the Z-axis direction, a function of adjusting the position of the substrate 10 in a ωz direction, and a tilt function of correcting the tilt of the substrate 10.

The substrate holding mechanism 16 can include a plurality of reference mirrors 18 corresponding to respective X, Y, Z, ωx, ωy, and ωz directions. The imprint apparatus 1 includes a plurality of laser interferometers (measuring devices) 19 which measure the position of the substrate holding mechanism 16 by irradiating the respective reference mirrors 18 with beams. The laser interferometers 19 measure the position of the substrate holding mechanism 16 and based on that measurement value, the controller 7 performs positioning control of the substrate 10.

The dispenser 5 is installed near the mold holding mechanism 11 and dispenses (supplies) the uncured resin 14 onto the substrate 10. The amount of the uncured resin 14 discharged from the dispenser 5 can be decided in accordance with the thickness, the density, and the like of a pattern that should be formed on the substrate 10.

The imprint apparatus 1 includes, in the imprint process, an alignment measurement unit 6 configured to obtain position information of pattern formation regions (shot regions) 27 of the substrate 10 (refer to FIGS. 1 and 2). Alignment light 35 emitted from the alignment measurement unit 6 is transmitted through the dichroic mirror 36, and is used to irradiate an alignment mark 23a on the mold 8 and alignment marks 23b on the substrate 10. The alignment light 35 reflected by the alignment marks 23a and 23b enters the alignment measurement unit 6. The alignment measurement unit 6 obtains, based on the incident alignment light 35, information indicating the relative positions of the pattern portion 8a and the pattern formation region 27.

The controller 7 can be configured to control the operation, adjustment, and the like of each constituent element of the imprint apparatus 1. For example, the controller 7 is formed by a computer or the like and communicates with the respective constituent elements of the imprint apparatus 1. The controller 7 can be configured to control the respective constituent elements in accordance with programs installed therein. The controller 7 controls the operations of, for example, the mold operation mechanism 3, the substrate operation mechanism 4, the shape correction mechanism 38, the exposure illumination system 2, and the alignment measurement unit 6. The controller 7 may be formed integrally (in a common housing) with another portion of the imprint apparatus 1 or may be formed separately (in a separate housing) from the other portion of the imprint apparatus 1.

The imprint apparatus 1 can also include a base plate 51 which supports the substrate operation mechanism 4, a bridge plate 28 which supports the mold operation mechanism 3, and a column 30 extended from the base plate 51 and configured to support the bridge plate 28 via an antivibrator 29. The antivibrator 29 blocks the vibration of a floor surface such that it is not transmitted to the bridge plate 28. The imprint apparatus 1 can further include a mold conveyance mechanism which conveys the mold 8 from the outside of the imprint apparatus 1 to the mold operation mechanism 3, a substrate conveyance mechanism which conveys the substrate 10 from the outside of the imprint apparatus 1 to the substrate operation mechanism 4, and the like.

Figure 3:
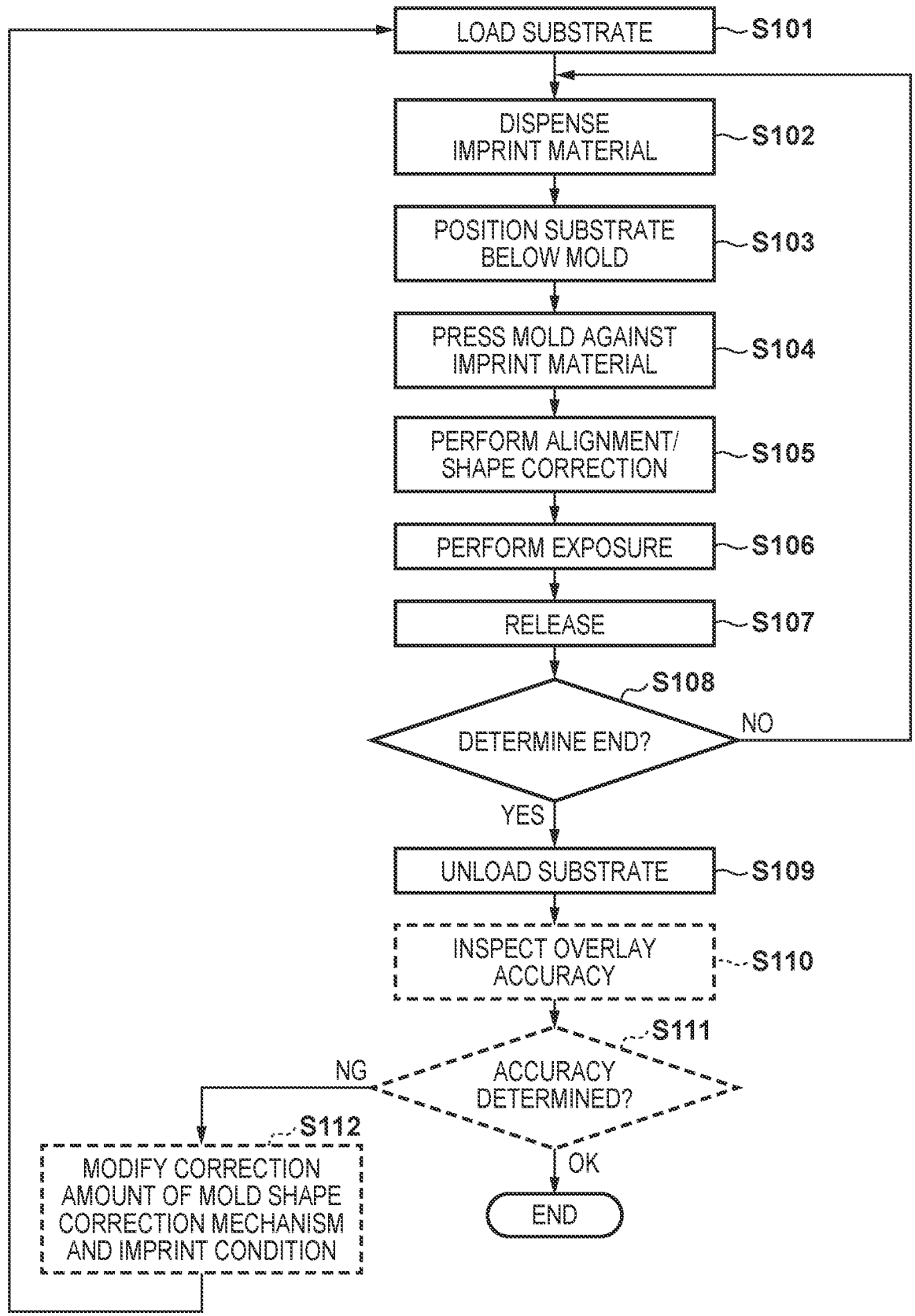
FIG. 3 is a flowchart showing the operation of the imprint apparatus shown in FIG. 1.

The operation of the imprint apparatus 1 will now be described with reference to FIG. 3. In step S101, the controller 7 controls the substrate conveyance mechanism such that the substrate 10 is loaded into the imprint apparatus 1 and placed on the substrate holding mechanism 16 of the substrate operation mechanism 4, and controls the substrate holding mechanism 16 so as to hold the substrate 10. Subsequently, in step S102, the controller 7 controls the substrate driving mechanism 17 such that the pattern formation regions 27 of the substrate 10 are positioned immediately below the dispenser 5 and controls the dispenser 5 so as to dispense (supply) the uncured resin 14 to the pattern formation regions 27.

Subsequently, in step S103, the controller 7 controls the substrate driving mechanism 17 such that the pattern formation regions 27 of the substrate 10 are positioned immediately below the mold 8. Subsequently, the controller 7 controls the mold driving mechanism 12 such that the pattern portion 8a of the mold 8 is pressed against the uncured resin 14 on the pattern formation regions 27 of the substrate 10. At this time, the shape of the mold 8 can be controlled such that the pattern portion 8a is warped into the convex shape toward the substrate 10. With this pressing, the uncured resin 14 fills the concave-convex portion of the pattern portion 8a of the mold 8.

Subsequently, in step S105, the controller 7 controls the alignment measurement unit 6 so as to detect the relative positions of the alignment mark 23a on the mold 8 and the alignment mark 23b on the substrate 10. In step S105, the controller 7 also calculates, based on a detection result by the alignment measurement unit 6, the relative shifts (X-axis and Y-axis directions) and rotations (ωz-axis) of the pattern formation region 27 of the substrate 10 and the pattern portion 8a of the mold 8. Then, the controller 7 controls the substrate driving mechanism 17 such that the relative shifts and rotations fall within an allowable range. In step S105, the controller 7 further causes the shape correction mechanism 38 to correct the shape of the pattern portion 8a such that the shape difference between the pattern formation regions 27 of the substrate 10 and the pattern portion 8a of the mold 8 becomes smaller. Note that the pattern formation regions 27 of the substrate 10 are shot regions (first regions) defined on the substrate 10 by using the projection exposure apparatus and include a group of patterns (group of first patterns) formed by using the projection exposure apparatus. In other words, the pattern formation regions 27 are defined by the group of patterns (group of first patterns) formed by using the projection exposure apparatus. The group of patterns includes the alignment marks 23b. The shot regions are regions each in which the group of patterns is formed by one exposure operation (shot).

Subsequently, in step S106, the controller 7 controls the exposure illumination system 2 such that the uncured resin 14 is irradiated with the light 9. The uncured resin 14 is cured by being irradiated with the light 9. Consequently, a group of patterns (group of second patterns) of the resin is formed such that a new pattern formation regions (second regions) are defined on the pattern formation regions 27 (first regions) of the substrate 10. Subsequently, in step S107, the controller 7 controls the substrate driving mechanism 17 so as to separate the mold 8 from the cured resin. Note that steps S102 to S107 are the second process (imprint process) of forming the group of patterns (group of second patterns) of the resin such that the new pattern formation regions (second regions) are defined on the pattern formation regions 27 (first regions).

Subsequently, in step S108, the controller 7 judges whether new patterns (second patterns) are formed on all the pattern formation regions 27 (shot regions) of the substrate 10. If the unprocessed pattern formation regions 27 remain, the second process of steps S102 to S107 is performed on those unprocessed pattern formation regions 27. If the unprocessed pattern formation regions 27 do not remain, the process of the substrate 10 is ended. Then, in step S109, the controller 7 controls the substrate operation mechanism 4 and the substrate conveyance mechanism such that the substrate 10 is ejected outside the imprint apparatus 1.

Steps S110, S111, and S112 can be performed additionally in order to, for example, set a condition for manufacturing the article. In step S110, the accuracy of the overlay between the patterns (second patterns) of the resin formed on the substrate 10 and the patterns (first patterns) of the pattern formation regions 27 below them can be inspected. Then, in step S111, it is determined whether the overlay accuracy satisfies a reference. If the accuracy satisfies the reference, the article starts or continues to be produced on a current imprint condition. If the accuracy does not satisfy the reference, in step S112, the correction amount by the shape correction mechanism 38 and/or the imprint condition is modified based on an inspection result in step S110, and the process from step S101 is performed on the new substrate 10.

Figure 4:
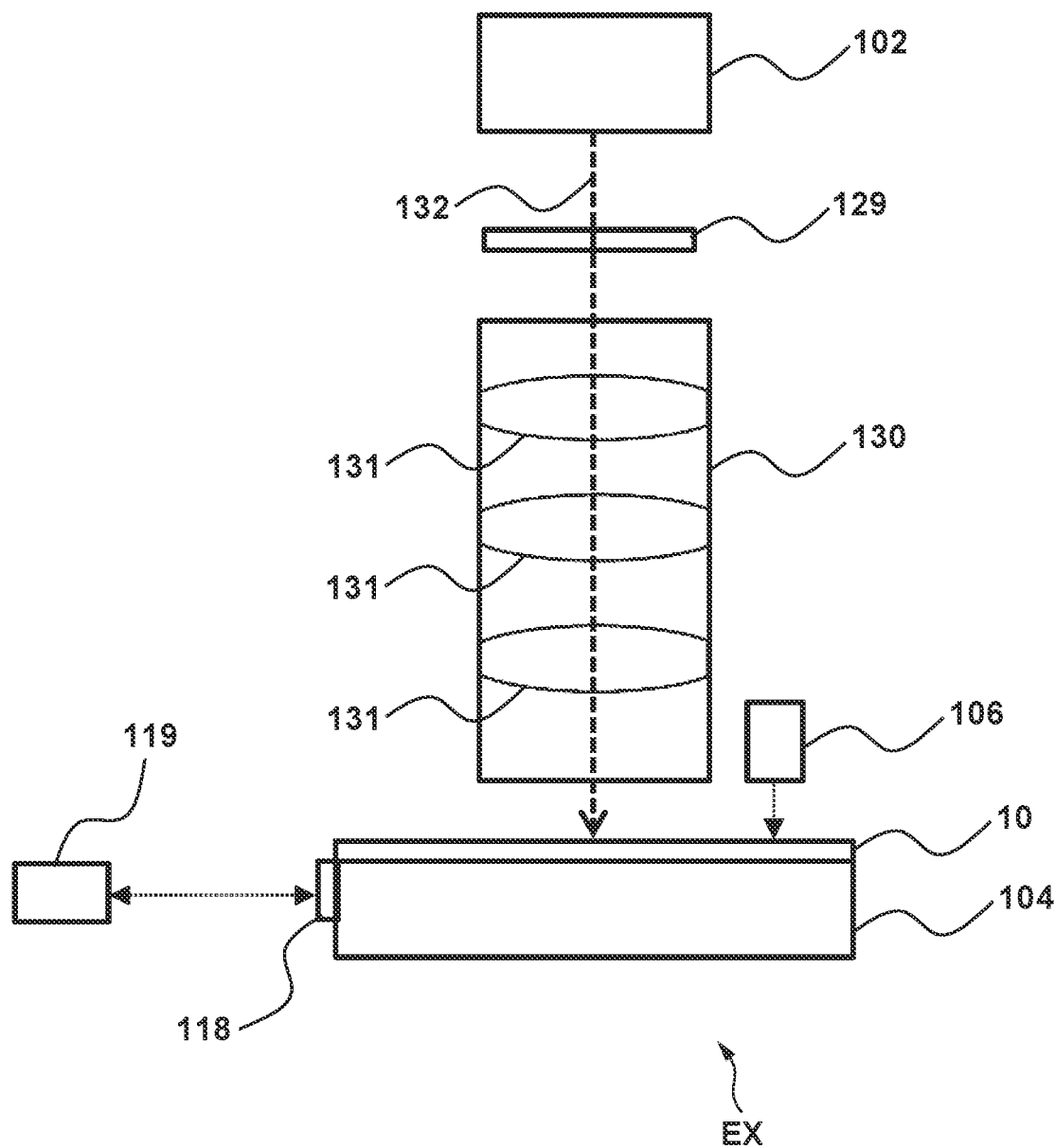
FIG. 4 is a view showing the arrangement of a projection exposure apparatus with which the first embodiment of the present invention can be provided.

FIG. 4 exemplarily shows the arrangement of a projection exposure apparatus EX with which the first embodiment of the present invention can be provided. The projection exposure apparatus EX causes an illumination system 102 to illuminate a reticle 129 and causes a projection optical system 130 to project a group of patterns of the reticle 129 on the substrate 10, thereby forming, on the substrate 10, a group of latent patterns which defines a shot region. More specifically, a photoresist film is formed in advance on the substrate 10, and the photoresist film is formed in the group of latent patterns. A group of resist patterns is formed by developing the photoresist film in which the group of latent patterns is formed. A group of patterns corresponding to the group of resist patterns is formed on the substrate 10 by processing (by performing, for example, etching, oxidation, ion implantation, or the like) the substrate on which the group of resist patterns is formed. The group of patterns defines the shot region.

The projection optical system 130 includes a plurality of optical elements 131. A substrate operation mechanism 104 can hold and position the substrate 10. The substrate operation mechanism 104 can include a substrate holding mechanism which holds the substrate 10 and a substrate driving mechanism which drives the substrate holding mechanism. A laser interferometer (measurement device) 119 can measure the position of the substrate 10 by using a reference mirror 118 provided in the substrate holding mechanism. The shape of the shot region defined on the substrate 10 can be corrected by adjusting at least one of the relative positions and attitudes of the reticle 129 and the substrate 10, and the position and attitude of at least one of the plurality of optical elements 131. When the projection exposure apparatus EX is configured as a scanning exposure apparatus, the relative speeds of the reticle 129 and the substrate 10 may be controlled.

Figures 6, 7:
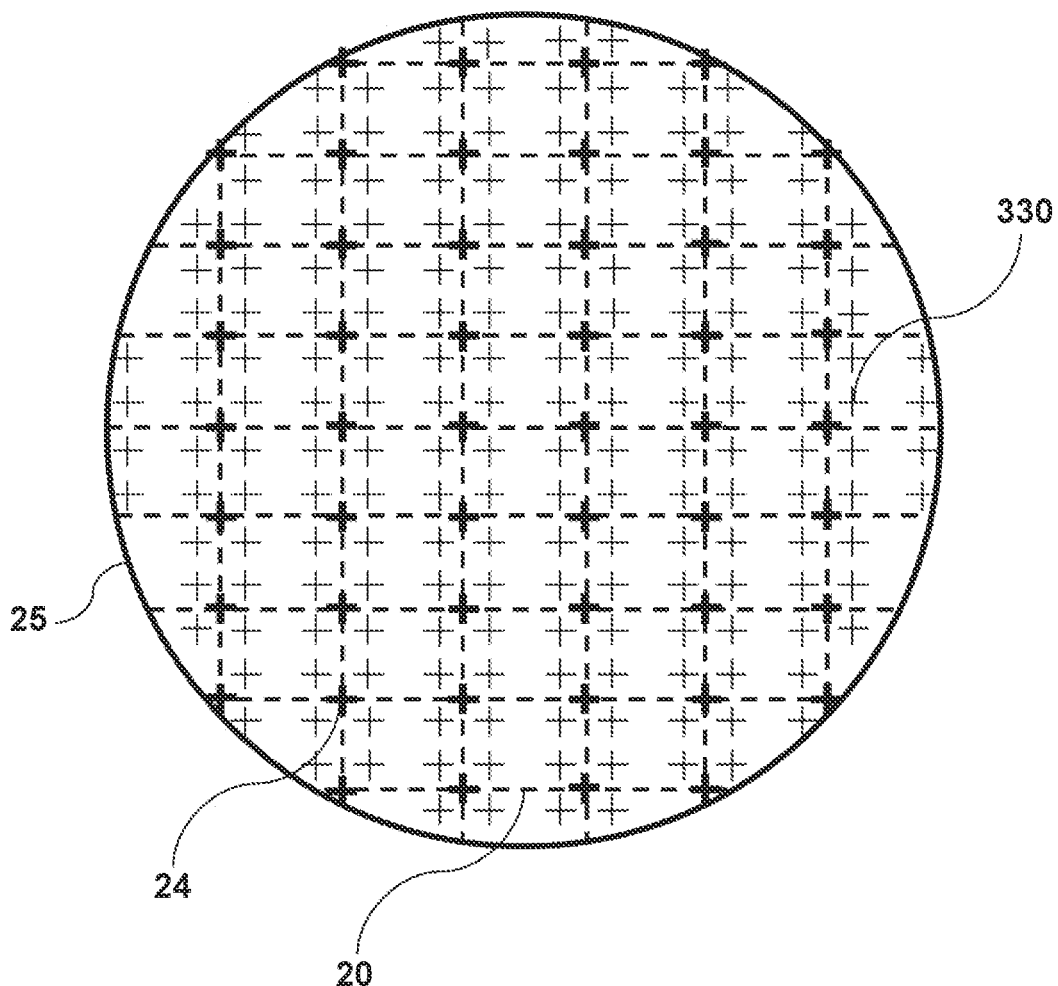
FIG. 6 is a view exemplifying the first marks formed on a test substrate by using the projection exposure apparatus.
FIG. 7 is a flowchart showing a pattern formation method according to the first embodiment of the present invention.
Figure 12:
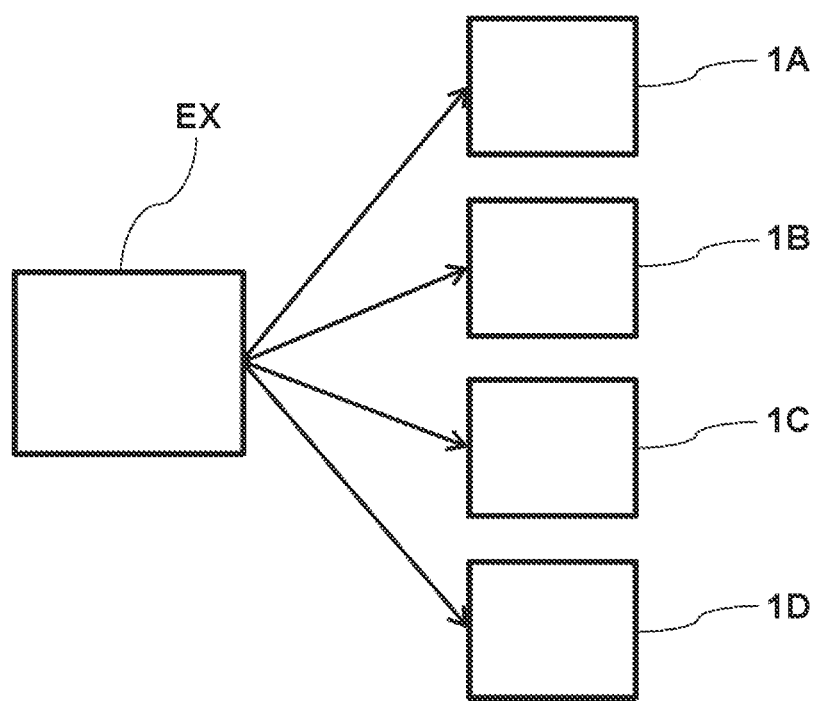
FIG. 12 is a view showing the arrangement of the imprint apparatus to which the first and second embodiments of the present invention can be applied.

A pattern formation method of forming the patterns on the substrate in equipment in which a plurality of imprint apparatuses (so-called cluster imprint apparatuses) are assigned to one projection exposure apparatus will exemplarily be described below with reference to FIGS. 12 and 7. FIG. 12 exemplifies cluster imprint apparatuses 1A to 1D consisting of four imprint apparatuses for one projection exposure apparatus EX. FIG. 7 shows the pattern formation method according to the first embodiment of the present invention. The pattern formation method includes the first step S210 and the second step S220 performed after the first step S210.

In the first step S210, the group of first patterns is formed by using the projection exposure apparatus EX such that the first region (first shot region) is defined on each of the plurality of substrates 10. The group of first patterns can include alignment patterns in addition to a group of device patterns such as a group of circuit patterns. The group of device patterns can be, for example, patterns which define a plurality of active regions, a plurality of wiring patterns, or a plurality of contact hole patterns. In the first step S210, the first region is defined so as to have a shape corresponding to a common component in deformation in the second region defined by each of the plurality of imprint apparatuses 1 in the second step.

In the second step S220, the group of second patterns is formed by using each of the plurality of imprint apparatuses 1 such that the second regions are defined on the first regions of the substrates 10 different from each other out of the plurality of substrates 10 that have undergone the first step S210. Note that as described above, each imprint apparatus 1 forms the group of second patterns by curing the uncured resin 14 in a state in which the mold 8 is pressed against the uncured resin 14 supplied onto the substrate 10. A plurality of second regions which are, respectively, defined by the plurality of imprint apparatuses 1 are different in shape but have a common deformation component (common component). Note that the common component can be a component arising from deformation in the molds 8 by pressing the molds 8 against the uncured resins 14 supplied onto the substrates 10. The group of second patterns can include alignment patterns in addition to a group of device patterns such as a group of circuit patterns.

A component other than the common component can include individual differences among the plurality of imprint apparatuses 1. The individual differences can be caused by, for example, the flatness of the mold holding surface (a surface for holding the mold 8) of each mold holding mechanism 11 or the flatness of the substrate holding surface (a surface for holding the substrate 10) of each substrate holding mechanism 16. The component other than the common component can also be caused by individual differences among, that is, manufacturing errors in the plurality of molds 8 which are, respectively, used in the plurality of imprint apparatuses 1. The manufacturing errors can be the order of several nm. The second step S220 can include a step of forming a layer such as an insulating layer or an electrical conducting layer on the substrate 10 before forming the group of second patterns. The layer can be patterned by etching by utilizing the group of second patterns as an etching mask.

The component other than the common component (the individual differences among the plurality of imprint apparatuses 1 or the individual differences among the plurality of molds 8) is an individual component of the shape of the second region arising from each of the plurality of imprint apparatuses 1. In the second step S220, the plurality of imprint apparatuses 1 can individually correct the individual components.

Figure 5A:
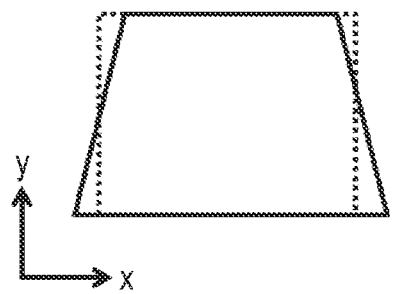
FIGS. 5A to 5D show views each exemplifying the shape of the first region (shot region) that can be defined by the projection exposure apparatus.
Figure 5B:
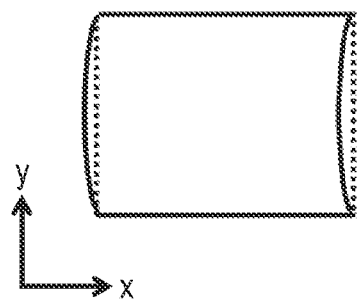
Figure 5C:
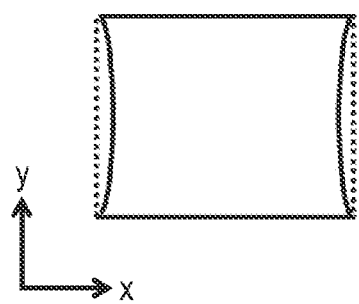
Figure 5D:
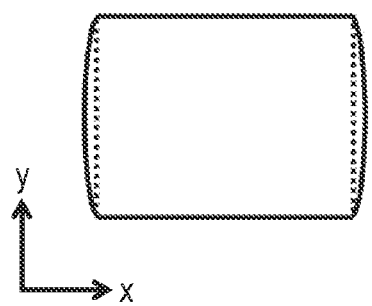

FIGS. 5A to 5D schematically show examples of the shape of the first region (shot region) that can be defined by the projection exposure apparatus EX used in the first step S210. For example, if at least one of the plurality of optical elements 131 and the reticle 129 is tilted relative to a plane perpendicular to an optical axis 132 of the projection optical system 130, as shown in FIG. 5A, the first region of a rectangle indicated by a dashed line can be deformed into the first region of a trapezoid indicated by a solid line. The first region of the rectangle indicated by the dashed line can also be deformed, by changing the positions and attitudes of at least one of the plurality of optical elements 131 and the reticle 129, into the first region of a bobbin shape, a barrel shape, an arc shape, and the like indicated by the solid line as shown in FIGS. 5B to 5D.

On the other hand, the imprint apparatus 1 includes the shape correction mechanism 38 in order to deform the shape of each second region (shot region) in which the group of second patterns is formed. The shot regions in the imprint apparatus 1 are regions each in which the group of patterns is formed on the substrate 10 by one imprint process. As exemplified in FIG. 2, the shape correction mechanism 38 includes a plurality of actuators 60 arranged such that they can apply forces to the side surfaces of the mold 8. The shape of the pattern portion 8a of the mold 8 can be deformed physically by applying the forces to the side surfaces of the mold 8 by the plurality of actuators 60.

However, the mold 8 that can be made of quartz or the like has a positive Poisson ratio, and thus, for example, expansion is caused in a direction perpendicular to a compression direction when a compression force is applied. Deformation caused by this expansion becomes a cause of deteriorating the overlay accuracy when the mold 8 is deformed into the shape such as the arc shape, the bobbin shape, the barrel shape, or the like or a shape having a higher order.

The shape correction mechanism 38 intentionally deforms the pattern portion 8a of the mold 8. However, unintended deformation in the pattern portion 8a of the mold 8 may also be caused in the imprint apparatus 1. Unintended deformation may be caused by pressing the pattern portion 8a against the uncured resin 14 in step S104. In one example, this pressing may deform the pattern portion 8a with an nm order. This may deform the second regions (shot regions) each in which the group of second patterns is formed. Deformation in the pattern portion 8a caused by pressing the pattern portion 8a against the uncured resin 14 can include, for example, shapes expressed by the second- or higher order polynomial such as the shapes of the trapezoid, the arc shape, the bobbin shape, the barrel shape, and the like shown in, for example, FIGS. 5A to 5D. Polynomials (only in an X direction) of respective deformation components are given by:

$$\text{trapezoid: } dx = K9 \text{ (ppm/mm}^2\text{)} \cdot X \cdot Y \quad (1)$$

$$\text{arc shape: } dx = K11 \text{ (ppm/mm}^2\text{)} \cdot Y^2 \quad (2)$$

$$\text{bobbin shape: } dx = K17 \text{ (ppm/mm}^3\text{)} \cdot X \cdot Y^2 \quad (3)$$

$$\text{barrel shape: } dx = -K17 \text{ (ppm/mm}^3\text{)} \cdot X \cdot Y^2 \quad (4)$$

It is difficult for deformation of the second or higher order to obtain a sufficient correction effect by the shape correction mechanism 38. Note that an experiment has confirmed that components arising from deformation in the molds 8 out of deformation in the second regions caused by pressing the molds 8 against the uncured resins 14 on the substrates 10 are generally common in the plurality of molds 8 which are, respectively, used in the plurality of imprint apparatuses 1. That is, letting a common component be the components arising from deformation in the molds 8 caused by pressing the molds 8 against the uncured resins 14 on the substrates 10, it is advantageous to define the first regions so as to have the shapes corresponding to the common component by the projection exposure apparatus EX in the first step S210.

Figure 8:
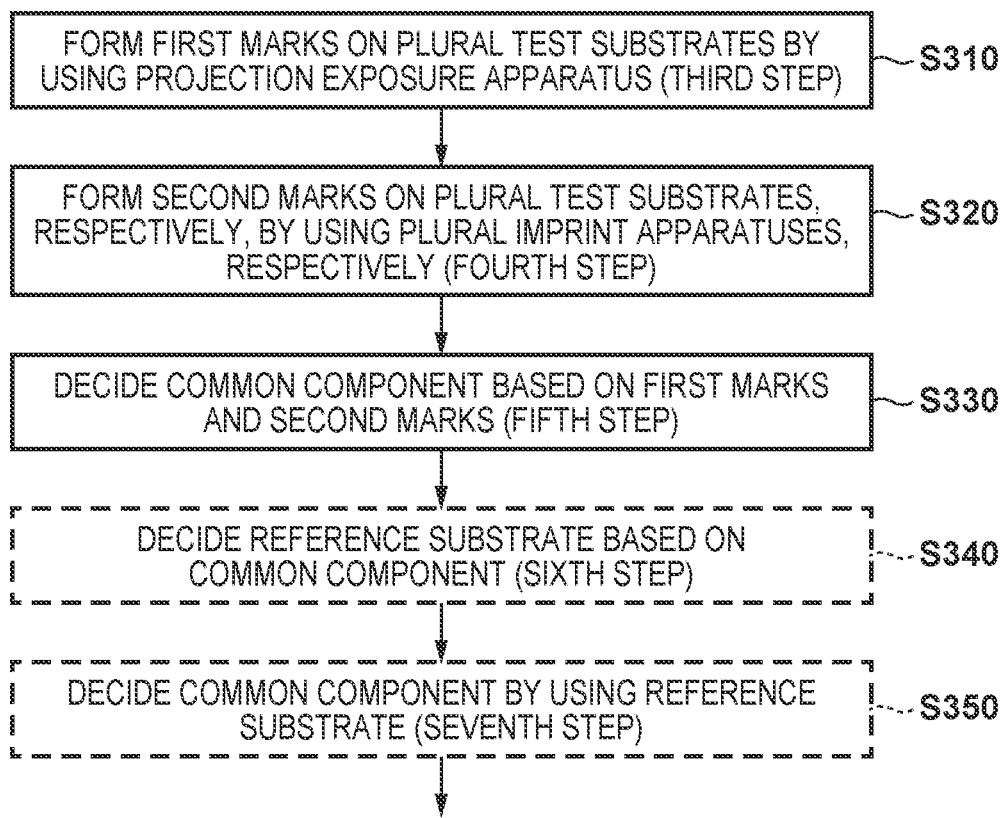
FIG. 8 is a flowchart showing additional steps in the pattern formation method according to the first embodiment of the present invention.

FIG. 8 exemplifies a method of deciding the common component in deformation in the second regions which are, respectively, defined by the plurality of imprint apparatuses 1. Based on the common component which is decided by the method exemplified in FIG. 8, the method exemplified in FIG. 7 can form the group of first patterns and the group of second patterns. In the third step S310, first marks 24 are formed on a plurality of test substrates 25 by using the projection exposure apparatus EX. FIG. 6 schematically shows the first marks 24 which are formed on each test substrate 25 formed in the third step S310. For example, in order to define regions 20 each having a rectangular shape corresponding to a shot region, the first marks 24 can be formed so as to define, for example, four vertices of each region 20.

Subsequently, in the fourth step S320, a plurality of second marks 330 are formed, by using the plurality of imprint apparatuses, respectively, with reference to the first marks 24 on the test substrates 25 different from each other out of the plurality of test substrates 25 that have undergone the third step S310. Note that forming the plurality of second marks 330 with reference to the first marks 24 means, for example, performing, with reference to the first marks 24, the imprint process while positioning an evaluation mold having a concave-convex pattern for forming the plurality of second marks 330. The fourth step S320 can be a step of performing steps S102 to S107 of FIG. 3 repeatedly on the plurality of regions 20 by using the evaluation mold. This makes it possible to form the second marks 330 such that new regions 33 are defined on the respective regions 20.

Subsequently, in the fifth step S330, the common component in deformation in the second regions which are, respectively, defined by the plurality of imprint apparatuses 1 is decided by evaluating the test substrates 25 that have undergone the third step S310 and the fourth step S320. The common component can be obtained by, for example, evaluating the array of the plurality of second marks 330 formed on the plurality of test substrates 25.

Note that the common component can be a value obtained by, for example, averaging, for each deformation component, the respective deformation components expressed by the second- or higher order polynomial out of the plurality of deformation components indicating the shapes of the second regions defined on the plurality of substrates 10. In order to describe this in more detail, a plurality of (L) deformation components expressed by the second- or higher order polynomial out of the plurality of deformation components each indicating the shape of the second region are identified by identifiers i. Also, the plurality of (M) pattern formation regions 27 on the substrate 10 are identified by identifiers j, and the plurality of (N) substrates are identified by identifiers k. In this case, a common component regarding the ith components can be obtained by averaging the ith deformation components of the plurality of (j=1 to M) pattern formation regions 27, respectively, of the plurality of (k=1 to N) substrates 10. That is, a common component regarding the ith deformation components can be obtained by averaging the N×L ith deformation components.

Alternatively, the common component regarding the ith deformation components can be obtained by averaging the ith deformation components of the jth pattern formation regions 27 (the pattern formation regions present at the same position) in the plurality of substrates 10, respectively. That is, the common component regarding the ith deformation components can be obtained by averaging the ith deformation components of the N jth pattern formation regions 27.

Alternatively, the common component regarding the ith deformation components can be obtained by averaging the ith components of the pattern formation regions 27 forming groups in the plurality of substrates 10, respectively.

This evaluation can be performed by, for example, using the alignment measurement unit 6 in the imprint apparatus 1. The shape difference (such as the magnification difference) between each region 20 defined by the projection exposure apparatus and each region 33 defined by the imprint apparatus can be obtained by detecting the first marks and the second marks formed on the test substrates. In this case, the controller 7 can perform, based on an evaluation result, a process of deciding the common component. Alternatively, this evaluation can be performed by using another evaluation apparatus. The process of deciding the common component may be performed by the controller 7 that has received the evaluation result or may be performed by an external computer. The common component can be obtained by, for example, extracting the second- or higher order term indicating deformation in the regions 33 on the respective test substrates 25. Alternatively, the common component may be a minimum value of the deformation amounts of the regions 33 obtained from the evaluations of the plurality of test substrates 25. Based on the common component obtained in step S330, the group of first patterns and the group of second patterns can be formed by the method exemplified in FIG. 7.

The sixth step S340 and the seventh step S350 can be executed arbitrarily. The sixth step S340 and the seventh step S350 are advantageous in a case in which the projection exposure apparatus EX is an imprint apparatus having a function of deciding the common component by evaluating an evaluation reference substrate.

In the sixth step S340, the test substrate 25, out of the plurality of test substrates 25 that have undergone the third step S310 and the fourth step S320, on which the shape of each region 33 defined by a corresponding one of the plurality of second marks 330 is close to the common component decided in the fifth step S330 can be decided as a reference substrate. The controller 7 or the external computer of one of the plurality of imprint apparatuses 1 can perform the sixth step S340.

In the seventh step S350, in the projection exposure apparatus EX, the common component is decided by using the reference substrate decided in the sixth step S340. Taking a more concrete example, the reference substrate can be loaded into the projection exposure apparatus EX, the positions of the plurality of second marks 330 can be detected by using a measurement device 106, and based on that detection result, the common component can be decided and provided with the first step S210 described above. The measurement device 106 can be, for example, an off-axis scope and/or an alignment scope.

In the first step S210, a correction amount can be decided based on the common component in order to define the first regions on the manufacturing substrate 10. This correction amount is used to, for example, correct a parameter for controlling the positions and attitudes of at least one of the plurality of optical elements 131 and the reticle 129. In order to describe more easily, assume that the shape of each region 33 exemplified in FIG. 8 is obtained by the common component. Under this assumption, the correction amount can be used to correct the parameter for controlling the positions and attitudes of at least one of the plurality of optical elements 131 and the reticle 129 such that the projection exposure apparatus EX exposes a region having the same shape as the regions 33.

In the evaluation of the common component described above, the same common component may be decided in all the regions 33 on the test substrates 25, or the common component may be decided for each group made of one or the plurality of regions 33. That is, the same common component may be decided in all the shot regions, or the common component may be decided for each group made of one or a plurality of regions.

Figure 10:
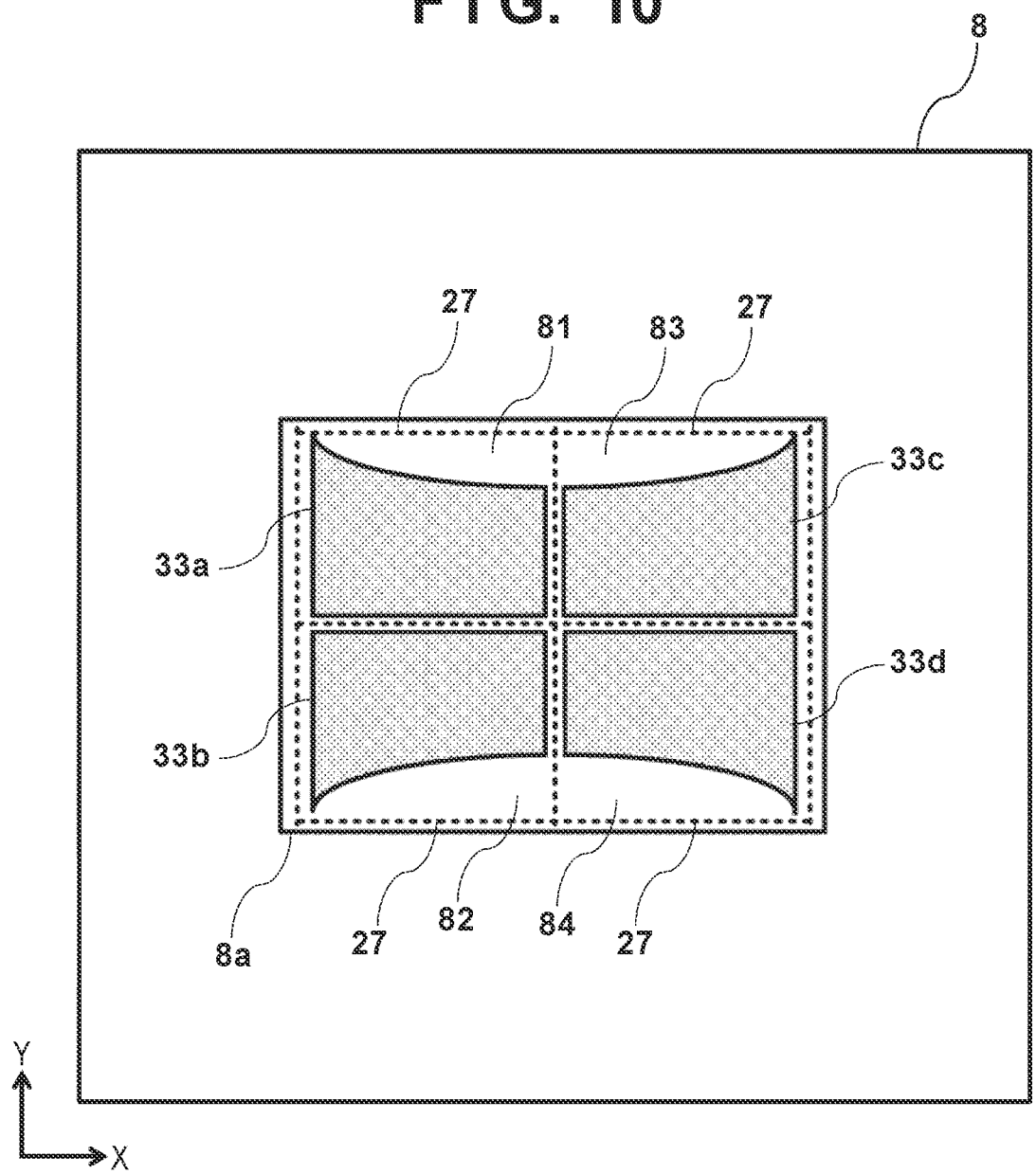
FIG. 10 is a view showing an example in which a pattern portion of a mold includes a plurality of chip regions.
Figure 11:
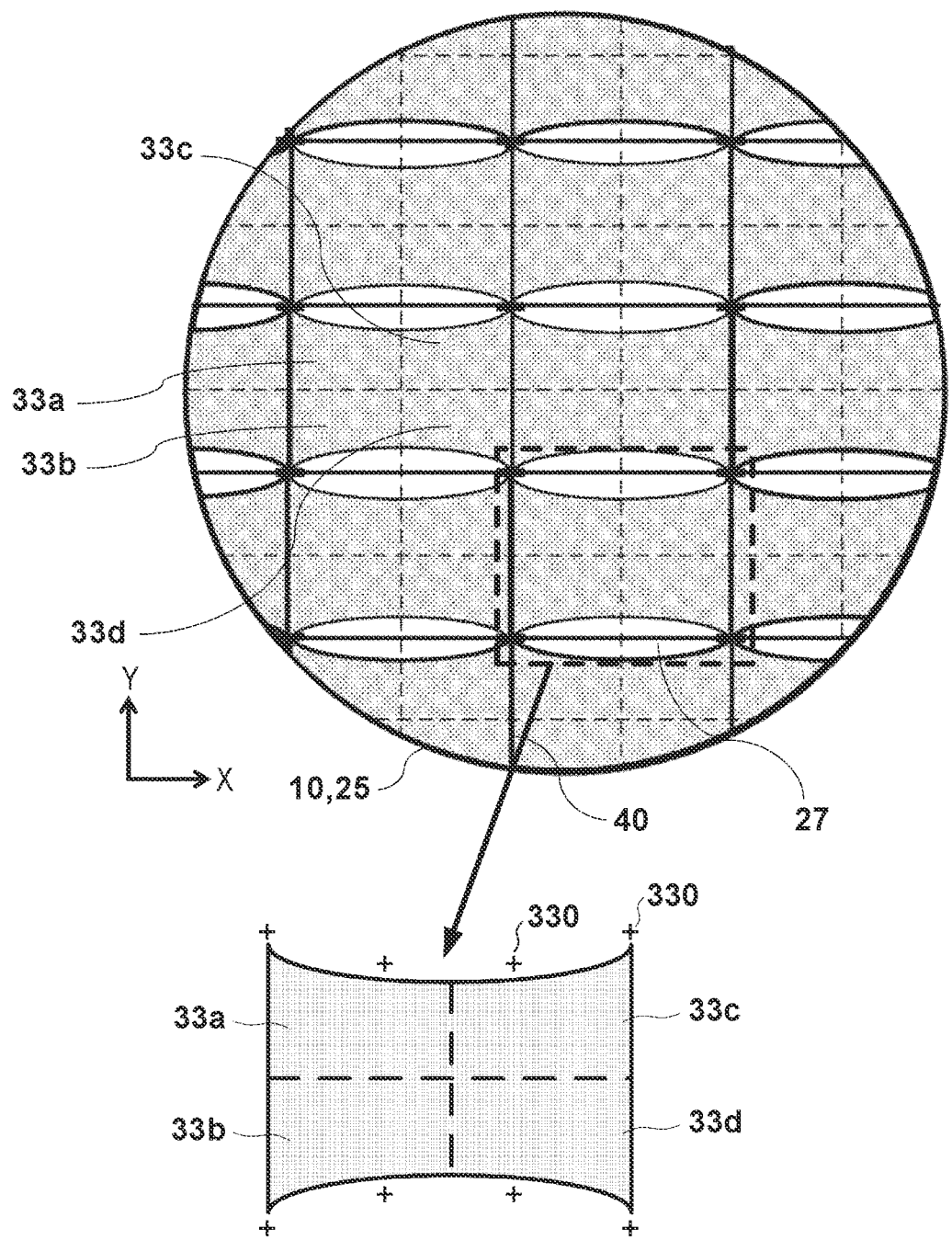
FIG. 11 is a view exemplifying a test substrate formed by using the mold shown in FIG. 10.

The pattern portion 8a of the mold 8 may be formed only by a group of patterns for one chip. However, the pattern portion 8a of the mold 8 may be formed by a group of patterns for a plurality of chip regions as exemplified in FIGS. 10 and 11. In an example shown in each of FIGS. 10 and 11, the pattern portion 8a includes a plurality of adjacent partial regions 81, 82, 83, and 84 each corresponding to one chip region, and the group of patterns is arranged in each partial region. Note that the chip regions are regions cut from the substrate 10 ultimately. Using such a mold 8 allows the group of patterns to be formed for each of the plurality of pattern formation regions 27 in one imprint process. In FIGS. 10 and 11, regions 33a, 33b, 33c, and 33d schematically show regions defined on the substrate 10 or the test substrate 25 in one imprint process. In the example shown in FIG. 10, the regions 33a, 33b, 33c, and 33d have deformation in a bobbin shape having curved sides parallel to an X-axis.

In order to calculate the common component, first, for each substrate 10, the deformation component is calculated from the shape difference between the first region in which the group of first patterns is formed by the projection exposure apparatus EX and the second region in which the group of second patterns is formed by the imprint apparatus. Subsequently, let the common component be an average value obtained for each deformation component expressed by the second- or higher order in the deformation components obtained from the plurality of substrates 10, as described above. Alternatively, as another method, the common component may be obtained for each position of the pattern formation region on the substrate 10.

Further, when the second regions are defined by forming the groups of second patterns at once on the plurality of first regions, the common component common among the substrates may be calculated for each of the second regions in which the groups of second patterns are formed at once. The accuracy of the overlay between the group of first patterns in each first region and the group of second patterns in each second region can be increased by setting the obtained common component as the correction amount of the projection exposure apparatus EX used in the first step S210.

Second Embodiment

The second embodiment is obtained by modifying the first embodiment. Matters that are not mentioned in the second embodiment comply with the first embodiment. In the second embodiment, a group of inspection patterns is formed on a reference substrate 25 by using a projection exposure apparatus EX, and an error in the overlay between the group of inspection patterns and each second mark 330 (each mark formed by an imprint apparatus 1) on the reference substrate 25 is measured, thereby deciding a common component.

Figure 9:
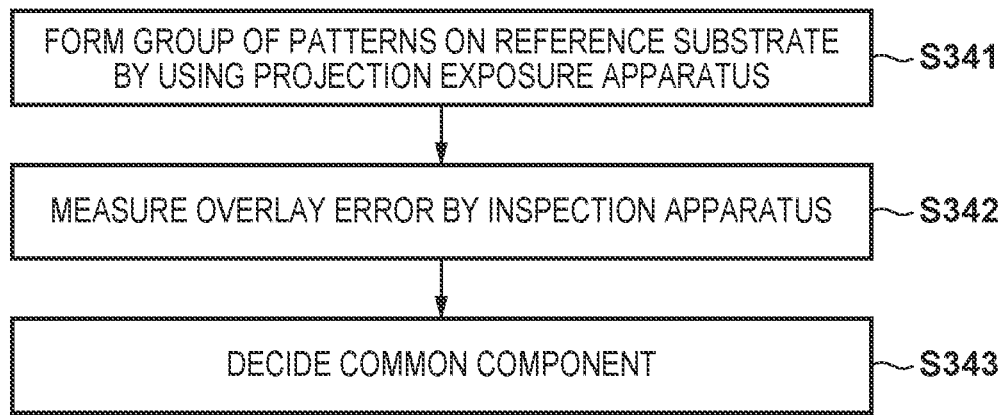
FIG. 9 is a flowchart showing additional steps in a pattern formation method according to the second embodiment of the present invention.

FIG. 9 shows a procedure according to the second embodiment. In step S341, the group of inspection patterns is formed, by using the projection exposure apparatus EX, on the reference substrate 25 decided in the sixth step S340 of FIG. 8. Taking a more concrete example, first, a layer made of an insulating material or an electrical conducting material is formed on the reference substrate 25, and a photoresist film is formed thereon. Then, a group of latent patterns is formed in the photoresist film by exposing the photoresist film with the projection exposure apparatus EX. Then, a group of resist patterns is formed by developing the photoresist film in which the group of latent patterns is formed. Then, the group of inspection patterns can be formed by etching the layer of the reference substrate 25 on which the group of resist patterns is formed. This group of inspection patterns can include a plurality of marks.

In step S342, the error in the overlay between the group of inspection patterns and each second mark 330 (each mark formed by the imprint apparatus 1) on the reference substrate 25 that has undergone step S341 is measured by using an overlay inspection apparatus. In step S343, the common component can be decided based on a measurement result in step S342 and provided with the first step S210 described above.

An article manufacturing method according to one embodiment of the present invention will be described below. The article manufacturing method includes a processing step of processing the substrate that has undergone the first step S210 and the second step S220. The processing step can include, for example, a step of patterning a layer such as an insulating layer or an electrical conducting layer by etching by utilizing a group of second patterns as an etching mask if the second step S220 includes a step of forming the layer. Alternatively, the processing step can include a step of implanting ions into a substrate 10 by using the group of second patterns as an ion implantation mask. Alternatively, the processing step can include a step of oxidizing the substrate using the group of second patterns as a mask.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2016-020240, filed Feb. 4, 2016, and 2017-004610, filed Jan. 13, 2017, which are hereby incorporated by reference herein in their entirety.

What is claimed is:

1. A method of forming a pattern on a substrate, the method comprising:
deciding a common deformation component;
forming, after the deciding of the common deformation component, a group of first patterns to define a first region on each of a plurality of substrates using a single projection exposure apparatus;
forming a group of second patterns to define a second region on the first region of each of the plurality of substrates using one of a plurality of imprint apparatuses,
wherein a plurality of second regions, which are respectively defined by the plurality of imprint apparatuses in the forming of the group of second patterns, are different in shape but have the common deformation component, and
wherein the forming of the group of first patterns deforms the first regions in accordance with the common deformation component.

2. The method according to claim 1, wherein:
each of the plurality of imprint apparatuses forms the group of second patterns by curing an imprint material supplied onto the substrate in a state where the imprint material is pressed against a mold, and
the common deformation component is a component arising from deformation in the mold caused by pressing the mold against the imprint material supplied onto the substrate.

3. The method according to claim 1, wherein the common deformation component includes a value obtained by averaging, for each deformation component, the respective deformation components expressed by not less than a second-order polynomial among a plurality of deformation components each indicating the shape of the second region defined on each of the plurality of substrates.

4. The method according to claim 1, wherein the common deformation component includes a value obtained by averaging, for each deformation component, the respective deformation components expressed by not less than a second-order polynomial among a plurality of deformation components indicating the shapes of the second regions defined at same positions of the plurality of substrates.

5. The method according to claim 1, further comprising:
forming first marks on a plurality of test substrates using the projection exposure apparatus; and
forming a plurality of second marks with reference to the first marks on the plurality of test substrates using the plurality of imprint apparatuses, respectively,
wherein the deciding of the common deformation component decides the common deformation component based on the plurality of second marks respectively formed using the plurality of imprint apparatuses.

6. The method according to claim 1, further comprising:
forming first marks on a plurality of test substrates using the projection exposure apparatus; and
forming a plurality of second marks with reference to the first marks on the plurality of test substrates using the plurality of imprint apparatuses, respectively,
wherein the deciding of the common deformation component decides the common deformation component based on the plurality of second marks respectively formed using the plurality of imprint apparatuses;
deciding, as a reference substrate, a test substrate, among the plurality of test substrates that have undergone the forming of the first marks and the forming of the second marks, on which a shape of a region defined by the second marks is close to the common deformation component; and
deciding, by the projection exposure apparatus, the common deformation component based on the plurality of second marks on the reference substrate.

7. The method according to claim 6, wherein in the forming of the group of second patterns, the second regions are defined by forming the group of second patterns at once on the plurality of adjacent first regions on the substrate.

8. The method according to claim 7, wherein the deciding of the common deformation component decides the common deformation component for each of the second regions where the group of second patterns are formed at once in the forming of the group of second patterns.

9. The method according to claim 1, wherein the forming of the group of second patterns, using the plurality of imprint apparatuses, individually corrects individual components of the shapes of the second regions arising from each of the plurality of imprint apparatuses.

10. The method according to claim 9, wherein each of the plurality of imprint apparatuses includes a shape correction mechanism configured to correct a shape of a mold and in the forming of the group of second patterns, and causes the shape correction mechanism to correct the individual components.

11. The method according to claim 10, wherein:
the group of first patterns includes an alignment mark, and
the forming of the group of second patterns controls deformation in the mold by the shape correction mechanism using the alignment mark in the forming of the group of first patterns.

12. The method according to claim 1, wherein:
the projection exposure apparatus includes a projection optical system configured to project a pattern of a reticle on the substrate, and
the forming of the group of first patterns controls, to deform the first regions in accordance with the common deformation component, at least one of relative positions and attitudes of the reticle and the substrate, or a position and an attitude of an optical element of the projection optical system.

13. The method according to claim 1, wherein the forming of the group of first patterns deforms the first regions so that the second regions defined by the common deformation component approach the first regions in shape.

14. A method of manufacturing an article, the method comprising:
   forming a group of first patterns and a group of second patterns on a substrate; and
   processing the substrate on which the group of second patterns is formed,
   wherein the forming of the group of first patterns and the group of second patterns includes:
      deciding a common deformation component;
      forming, after the deciding of the common deformation component, the group of first patterns to define a first region on each of a plurality of substrates using a single projection exposure apparatus;
      forming the group of second patterns to define a second region on the first region of each of the plurality of substrates using one of a plurality of imprint apparatuses,
      wherein a plurality of second regions, which are respectively defined by the plurality of imprint apparatuses in the forming of the group of second patterns, are different in shape but have the common deformation component, and
      wherein the forming of the group of first patterns deforms the first regions in accordance with the common deformation component.

* * * * *